United States Patent [19]

Nicollini et al.

[11] Patent Number: 4,965,468

[45] Date of Patent: Oct. 23, 1990

[54] HIGH RESOLUTION, FULLY DIFFERENTIAL CMOS COMPARATOR

[75] Inventors: Germano Nicollini, Piacenza; Pierangelo Confalonieri, Canonica d'Adda, both of Italy

[73] Assignee: SGS-Thomson Microelectronics s.r.l., Agrate Brianza, Italy

[21] Appl. No.: 417,588

[22] Filed: Oct. 5, 1989

[30] Foreign Application Priority Data

Oct. 6, 1988 [IT] Italy .................... 83669 A/88

[51] Int. Cl.⁵ .................... H03K 5/24; H03K 3/356
[52] U.S. Cl. .................... 307/362; 307/279; 307/530; 307/494; 330/253; 330/258; 330/311
[58] Field of Search ............. 307/360, 530, 279, 362, 307/491, 494; 330/253, 258, 311

[56] References Cited

U.S. PATENT DOCUMENTS 4,521,703  6/1985  Dingwall .................... 307/530
4,717,838  1/1988  Brehmer et al. .................... 307/530
4,808,944  2/1989  Taylor .................... 330/253

*Primary Examiner*—John Zazworsky
*Attorney, Agent, or Firm*—Bierman and Muserlian

[57] ABSTRACT

A high resolution, fully differential, CMOS comparator advantageously employs a single high-gain, "folded cascode", fully differential operational amplifier and an output latch circuit and the output common mode control of the high-gain amplifier is implemented without requiring the use of a conventional control circuit, thus improving layout economy. The common mode control is performed by providing the latch with a differential input stage through which a common mode feedback network is realized which acts upon a pair of output transistors of the operational amplifier for effectively controlling the output common mode thereof. The comparator has a simplified layout and is remarkably faster because it has no additional capacitances loading the outputs of the amplifier.

2 Claims, 5 Drawing Sheets

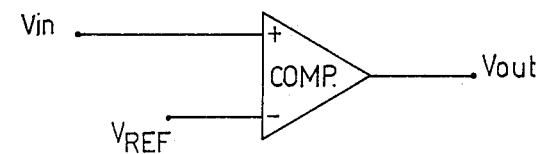
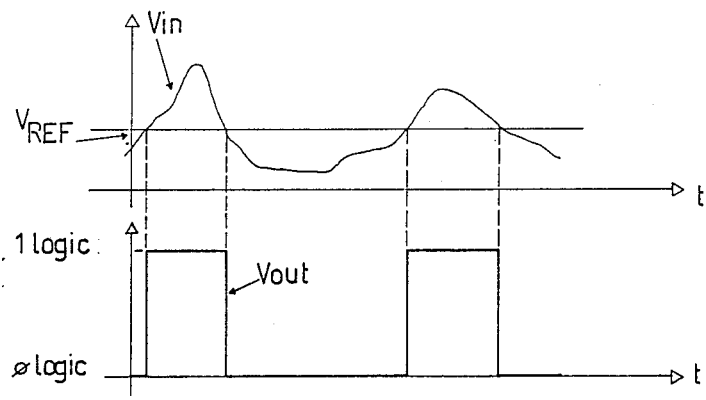
(prior art) FIG. 1
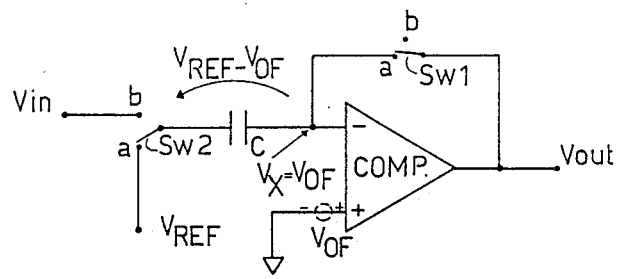
(prior art) FIG. 2a
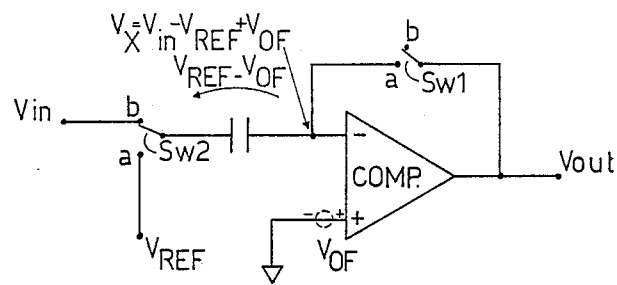
(prior art) FIG. 2b

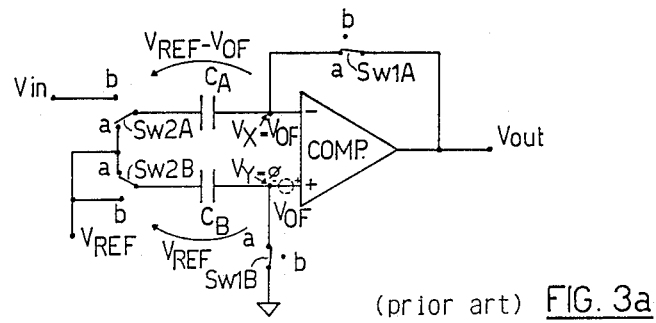
(prior art) FIG. 3a
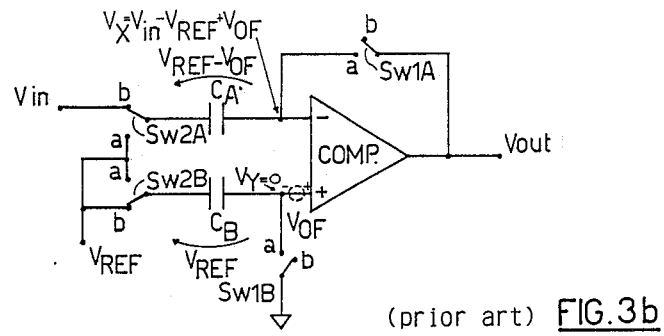
(prior art) FIG. 3b
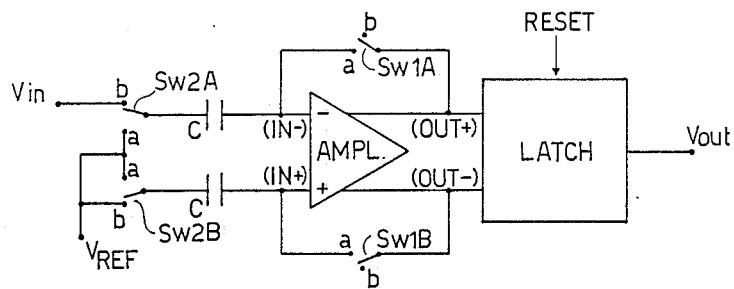
(prior art) FIG. 4
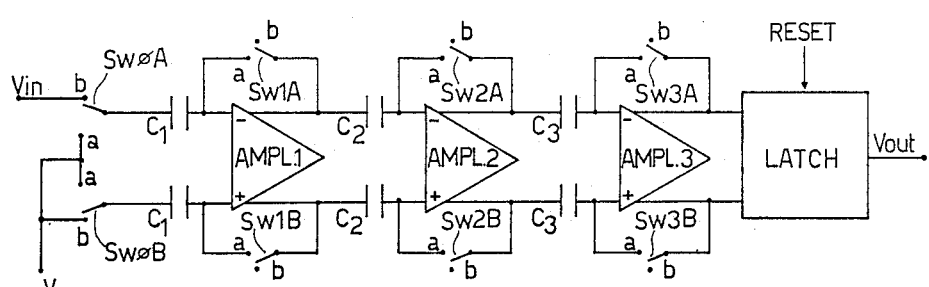
(prior art) FIG. 5

HIGH RESOLUTION, FULLY DIFFERENTIAL CMOS COMPARATOR

BACKGROUND OF THE INVENTION

1. Field of the Invention

The present invention relates to a high resolution, fully differential CMOS comparator utilizing a high gain, fully differential operational amplifier and an output latch and wherein the necessary control of the output common mode voltage of the high gain operational amplifier is implemented in a particularly effective way without using a dedicated output common mode control circuit.

A comparator must "detect" whether a varying signal Vin is larger or smaller than a fixed signal Vref, commonly referred to as the threshold voltage of the comparator, as schematically shown in FIG. 1. In other words, if Vin>Vref, the output signal of the comparator Vout must be, e.g. a logic "1", while if Vin<Vref, the output signal Vout must be a logic "0". Indicative of the resolution of the comparator is the minimum difference (Vin−Vref) which the comparator is capable of correctly detecting. Obviously the ultimate limitation for resolution is represented by the electronic noise intrinsic to the comparator circuit, however the basic limitation is in practice determined by the offset voltage of the comparator, as well known to the skilled technician, which may have a value of up to about 10 mV. In order to make high resolution ($\leq 100$ $\mu$V) comparators it is necessary to cancel the offset by means of additional circuitry and to reduce as much as possible the electronic noise by using low noise input stages.

2. Description of the Prior Art

In CMOS technology, where it is relatively easy to form capacitors and integrated switches, the most used solution for cancelling the offset is that of storing the Vref less the offset voltage (Vof) in a capacitance (C) during an operating phase immediately preceding the phase of comparison between the input signal and the threshold voltage (FIG. 2a). In this way, during the successive comparison phase (FIG. 2b), an effective cancellation of the offset is achieved. In fact when Vin=Vref, the Vx voltage present at the inverting (−) input terminal of the comparator is equal to Vof, thus the two input terminals of the comparator are at the same potential and therefore if Vin>Vref, Vx>0 so that the comparator's output commutes in a direction and if Vin<Vref, Vx<0 so that the comparator's output commutes in an opposite direction.

Comparators of this kind have a respectable but not extremely high resolution because this solution introduces an additional error factor due to the injection of charge in C by the integrated switch SWI when the latter switches from an (a) condition to a (b) condition; (Re: "Precision Variable Supply CMOS Comparator"—IEEE Journal of Solid State Circuits, Vol. SC-17, No. 6, December 1982).

For high precision comparators it is customary to cancel the offset by means of the above described switched capacitance input circuitry and to cancel or in any case reduce drastically the charge injection by the switch in the capacitor by reproducing on the noninverting input the same circuitry which is connected to the inverting input, as shown in FIGS. 3a and 3b. In this way in fact the charge $Q_{SW1A}$ injected by the switch SW1A in the capacitor $C_A$, which consequently develops on the inverting input an error voltage given by $Q_{SW1A}/C_A$, is in a first approximation equal to the charge injected by the switch SW1B in the capacitor $C_B$, which consequently develops on the noninverting input a similar error voltage given by $Q_{SW1B}/C_B$, thus the inputs of the comparator are subject to common mode shifting but not to a differential shift and therefore, being the comparator sensitive only to a difference of voltage between the inputs, an error caused by an injection of charge is not developed.

Because of the extremely high gain requirement (for input signals of about 100 $\mu$V output signals of about 10V must be obtained), it is common to form a comparator by utilizing several cascaded amplifying stages, each provided with its own circuit for cancelling its offset voltage, followed by a terminal latch circuit. The final latch stage, being a positive feedback circuit, is used for relaxing open-loop gain specifications of the amplifying stages, for which the only function becomes that of bringing the level of the minimum input signal which must be detected to a level such as to be greater in terms of absolute value than the offset voltage of the final latch circuit, an offset which cannot be cancelled, as it is well known to the skilled technician. By considering that in the worst of cases this offset may be of about 30 mV to 40 mV, for a lowest input signal level of 100 $\mu$V a gain of the single amplifying stage or of the cascaded amplifying stages which precede the final latch circuit of about 400 is needed.

The simplest solution is that of utilizing a single high gain amplifier (e.g. with a gain of about 1000) followed by a common latch circuit, as shown in FIG. 4, and where there is always a storing phase (a) of the amplifier offset and a comparison phase (b) of the signal Vin with the voltage Vref. The main problem of this solution is the fact that the amplifier, when the latter is of a fully differential type as it is often the case in MOS circuits as shown in FIG. 4, needs a dedicated circuit for stabilizing the output common mode voltage, as it is well known to the skilled technician (Re: "A Family of Differential NMOS Analog Circuits for a PCM Coded Filter Chip"—IEEE Journal of Solid State Circuits, Vol. SC-17, No. 6, December 1982); this special circuit for stabilizing the common mode is burdensome in terms of overall layout of the integrated circuit but above all it strongly loads the output of the amplifier during the comparison phase (b), so that the amplifier becomes relatively slow to react to an input signal and consequently the comparator takes a relatively much longer time to produce the result of the comparison at its output terminal.

Another known solution is that of using low gain (e.g. with a gain of about 10 to 20), fully differential amplifiers connected in cascade because these amplifiers do not need an output common mode stabilizing circuit as they exert this control automatically (Re: "A High Speed, High Precision Comparator Design for a 10 bit 15 MHz A-D Converter" memorandum No. UCB/ERL M85/86, Aug. 7, 1985, Electronics Research Laboratory, College of Engineering, University of California, Berkeley).

The main drawback of this other known solution is the fact that at least three or more operational amplifiers are generally needed, each of them being provided with respective switched capacitance input circuits for cancelling the respective offsets and therefore there is a remarkable burden in terms of layout, as it is evident from the block diagram shown in FIG. 5, in respect to the earlier solution using a single high gain amplifier shown in FIG. 4.

A typical example of a fully differential, high gain amplifier having a circuit for stabilizing the output common mode, which is used, according to the current technique, for making comparators of the type described in relation to FIG. 4, is depicted in FIG. 6. Essentially the fully differential, high gain amplifier is of the so-called "folded cascode" type and is formed essentially by transistors M1, M2, ... M10, M11 and M12. As it will be evident to the technician, the circuit for controlling the output common mode voltage is depicted within the two dash line squares A and B (for the output OUT+ and for the output OUT−, respectively). The circuit senses whether the common mode voltage or the half-sum of the voltages present at the two output terminals OUT+ and OUT− is different from the ground potential and consequently intervenes on the gates of the two MOS transistors M11 and M12 of the amplifier so as to modify the respective bias currents in order to return the common mode voltage of the two outputs near the ground potential of the circuit.

By contrast, a typical example of a fully differential, low gain amplifier which is used for forming the chain of cascaded amplifiers of a comparator made according to the block diagram depicted in FIG. 5, is shown in FIG. 7. Also in this case the structure of such a differential amplifier is familiar to the technician and does not require any particular description.

OBJECTIVE AND SUMMARY OF THE INVENTION

The main objective of the present invention is to provide an improved high resolution CMOS comparator without the above mentioned drawbacks of known comparators and which may be realized with a layout of reduced dimensions.

The objective is reached by the comparator object of the present invention which essentially employs a single, high gain, fully differential amplifier, intrinsically less burdensome in terms of layout than several relatively low gain amplifiers connected in cascade, while avoiding the necessity of implementing a specific circuit for stabilizing the output common mode voltage of the high gain differential amplifier and exploiting instead the final latch circuit of the comparator for effective feedback of the amplifier's common mode voltage. The comparator of the invention besides having a simplified layout has an increased response speed in so far the output of the differential amplifier is not loaded, as in the prior art, by the capacitances of a conventional circuit for stabilizing the output common mode.

The different aspects and advantages of the invention will become evident through the following detailed description of a comparator made in accordance with a preferred embodiment of the invention.

BRIEF DESCRIPTION OF THE DRAWINGS

FIG. 1 schematically depicts a comparator and the relative time diagrams of the input signals Vin and Vref and of the corresponding output voltage Vout produced by the comparator;

FIG. 2a is a functional diagram of a comparator provided with a circuit for storing, subtracting the offset voltage Vof and comparing, during a storage the offset phase;

FIG. 2b is a functional diagram of the comparator of FIG. 2a during a successive phase of subtraction of the offset voltage and comparison;

FIG. 3a is a functional diagram of a comparator wherein the switched capacitance input circuit for storing, subtracting the offset voltage and for the comparison is duplicated for both the input terminals of the comparator, depicted during a storage of the offset voltage Vof phase;

FIG. 3b is a functional diagram of the comparator of FIG. 3a during a subtraction of the offset voltage Vof and comparison phase;

FIG. 4 is a block diagram of a comparator made according to a first prior art solution employing a high-gain, fully differential operational amplifier and an output latch;

FIG. 5 is a block diagram of a comparator made according to another prior art solution employing a cascade of fully differential, low-gain operational amplifiers and an output latch;

Figure 6:
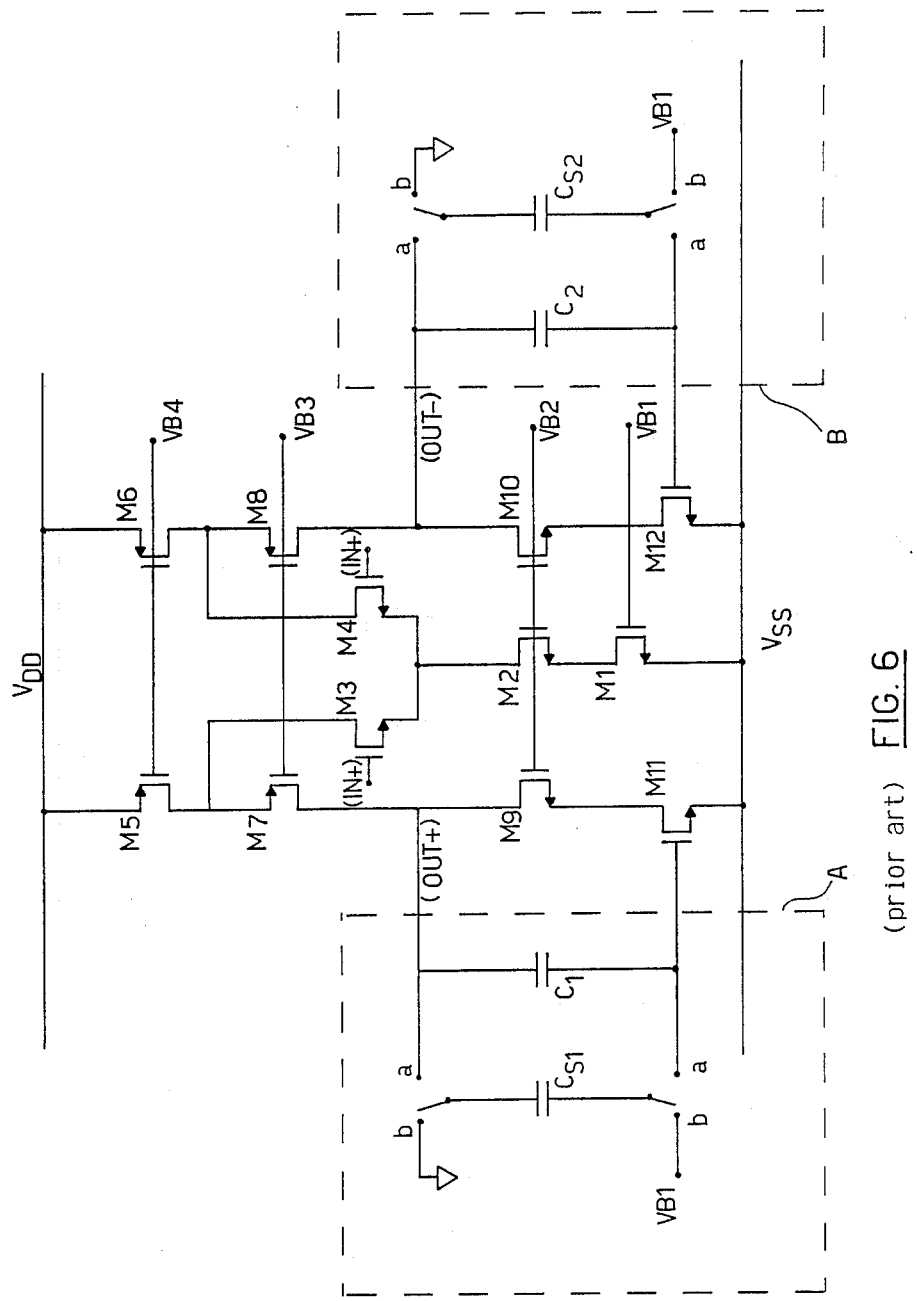
FIG. 6 is a circuit diagram of an high-gain, fully differential amplifier of the prior art used for making a comparator as depicted in FIG. 4, and which is provided with a switched capacitance circuit for stabilizing the output common mode voltage.
Figure 7:
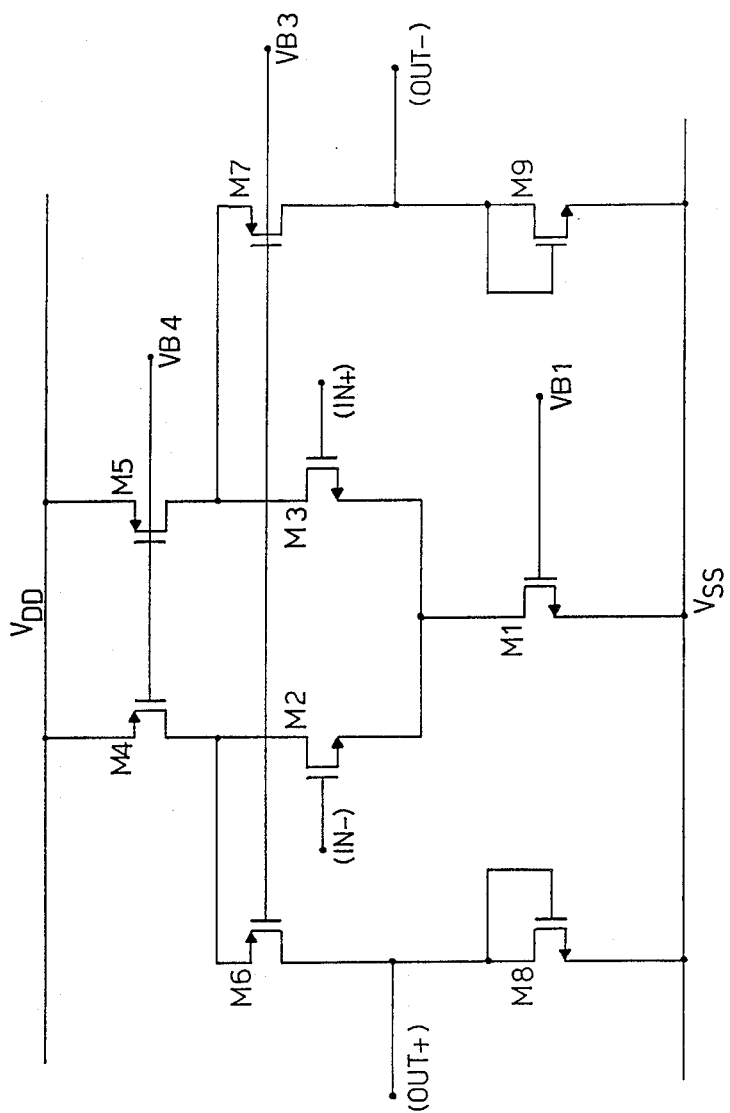
FIG. 7 is a circuit diagram of a low-gain, fully differential amplifier of the prior art used for making a comparator as the one depicted in FIG. 5.
Figure 8:
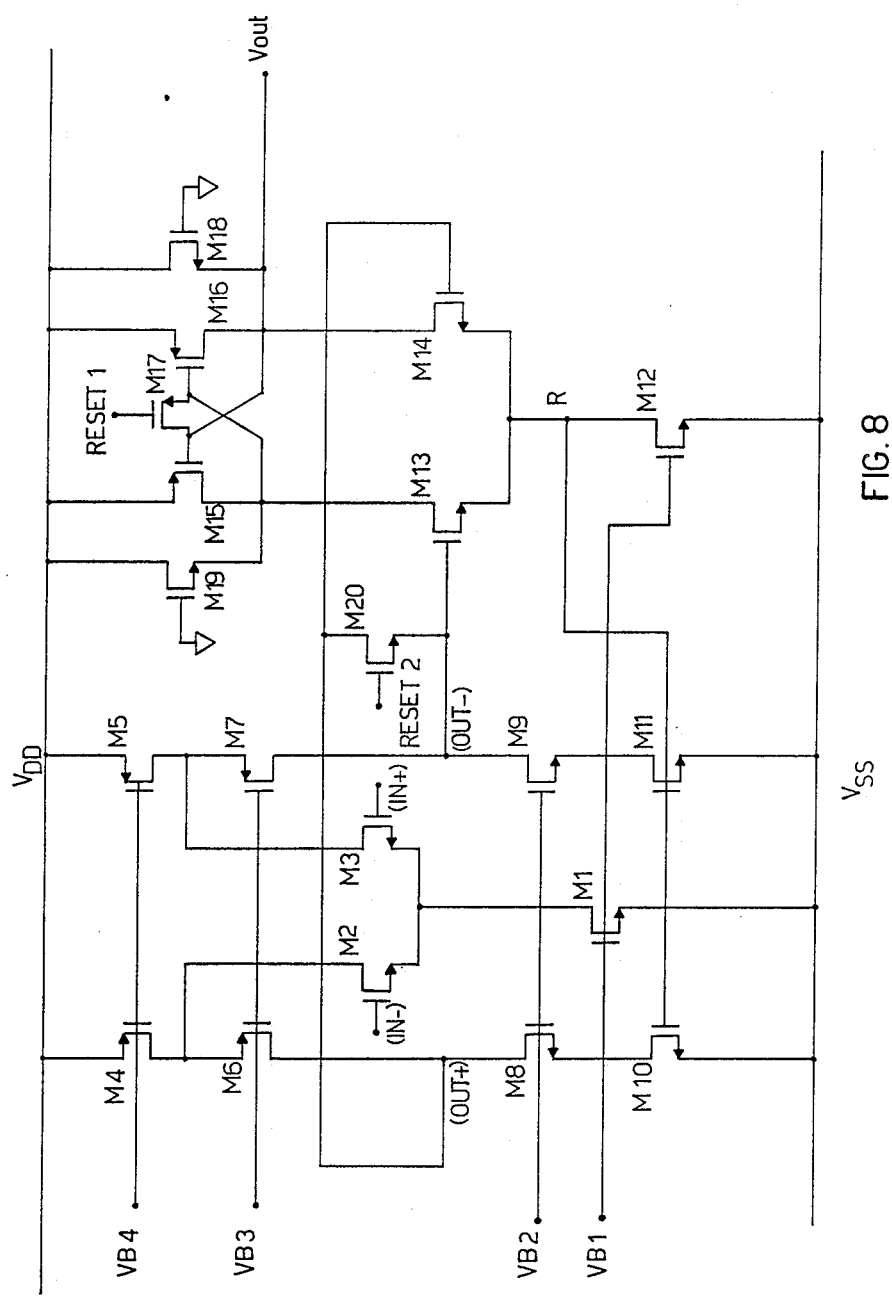
FIG. 8 is a circuit diagram of a high-gain, fully differential amplifier and of an output latch of a comparator made in accordance with the present invention.

In the circuit diagram depicted in FIG. 8 it is voluntarily omitted the indication of a switched capacitance input circuit for storage/subtraction of the offset and comparison because such a state of-the-art circuit is not pertinent to the illustration of the instant invention. It is intended that a functional block diagram of a comparator made in accordance with the present invention substantially corresponds to the functional block diagram depicted in FIG. 4.

DESCRIPTION OF THE PREFERRED EMBODIMENT

As depicted in FIG. 8, the high-gain, fully differential, operational amplifier is of the "folded cascode" type, a denomination which the skilled technician attributes to a differential amplifier configuration as the one formed by the MOS transistors M1-M11, generally consisting of a cascade of common-source and common-gate stages The output latch is typically formed by the pair of cross-coupled transistors M15 and M16 and between the respective gates thereof is connected a third transistor (integrated switch) M17, the gate of which is connected to an external reset terminal (RESET 1). Moreover the output latch circuit is purposely provided with an input differential stage formed by the differential pair of transistors M13 and M14 having their respective sources connected in common and to the drain of a transistor M12 operating as a biasing current generator for the whole latch circuit. As it may be observed in the figure, the gates of the two input transistors M13 and M14 of the input differential stage of the latch circuit are connected respectively to the outputs OUT− and OUT+ of the "folded cascode" type, high-gain amplifier and the input differential stage of the latch circuit transfers the output signal produced by the amplifier to the two input nodes of the real latch section, formed by the transistors M15, M16 and M17.

Preferably two additional transistors M19 and M18 are connected substantially in parallel to the respectively complementary transistor M15 and M16 of the latch for arresting the negative potential excursion of the drains of the transistors M13 (M15) and M14 (M16) in order to maintain the differential input stage at a correct operating condition, as it will be clarified later on. A further integrated switch constituted by the transistor M20 may be connected between the two outputs OUT− and OUT+ of the amplifier and the gate terminal of transistor M20 connected to a control terminal RESET 2, for speed purposes. Finally the gates of the output transistor pair M10 and M11 of the "folded cascode" amplifier are connected in common to the node R of the input differential stage of the latch circuit, thus realizing a common mode feedback directly through the differential input stage of the latch circuit capable of controlling the output common mode voltage of the high gain, "folded cascode" amplifier without requiring any additional common mode control circuitry.

OPERATION

During a storage of the offset voltage phase of the high gain, "folded cascode", operational amplifier, the outputs OUT+ and OUT− of the amplifier are short circuited respectively with the inverting input (IN−) by means of the switch SW1A and with the noninverting input (IN+) by means of the switch SW1B, according to the functional block diagram of FIG. 4. With reference now to the circuit of the invention of FIG. 8, the switch M20 is OFF (switch open) in order not to reduce the gain and the switch M17 is ON (switch closed) in order to set the latch in an equilibrium condition, i.e. with the output voltage Vout at an intermediate potential between the "0" and "1" logic potentials.

Moreover the outputs OUT+ and OUT− of the amplifier are set at a potential level near to the design value by the differential input stage of the latch circuit which is formed by the MOS transistors M13, M14 and M12, which intervenes to modify the bias voltage of the pair of output MOS transistors M10 and M11 of the operational amplifier so as to produce a negative feedback on the output nodes OUT+ and OUT− of the amplifier; feedback which essentially is of common mode as it will be evident to the skilled technician.

During the successive phase of subtraction of the offset and of comparison, the outputs OUT+ and OUT− are disconnected from the inputs IN− and IN+, respectively, by means of the opening of the switches SW1A and SW1B (re: FIG. 4). The Vin signal, so freed of any offset component, is coupled by means of the capacitor C to the input IN− of the amplifier and consequently the outputs of the amplifier move in opposite directions (FIG. 4).

With reference again to the circuit of the invention of FIG. 8, so long as the difference between the outputs OUT+ and OUT− is small, the common source of the input differential pair M13 and M14 of the latch circuit (node R) does not sense the differential signal at the inputs (gates of M13 and M14) therefore the feedback network for controlling the output common mode of the amplifier does not act upon the differential mode. Conversely when the difference between the outputs OUT+ and OUT− of the amplifier becomes sufficiently large, one of the two MOS transistors M13 or M14 of the input differential pair of the latch circuit cuts-off and therefore the common source node (node R) potential follows the gate to which the output of the amplifier which is raising in voltage is connected and, through the pair of transistors M10 and M11 of the amplifier, a positive feedback to the output of the amplifier which is dropping in voltage, thus further increasing the speed, and a negative feedback to the output of the amplifier which is rising in voltage thus arresting the rise to a certain voltage level, are implemented. It must be underlined the fact that this represents an additional advantage of the circuit of the invention because by otherwise permitting to the outputs of the amplifier to rise excessively in potential, may bring the MOS transistor of the latch which is ON outside saturation zone.

After a period of time sufficient to ensure that the difference between the outputs has reached a value surely larger than the offset of the latch circuit, the switch is opened (or the transistor M17 is cut-off) by means of the RESET 1 terminal in order to permit to the latch to perform its function. Since the latch is a positive feedback circuit (transistors M15 and M16 are "cross-coupled"), the evaluation is extremely fast.

MOS transistors M18 and M19 have the only function of preventing that their source potentials drop that much to bring the transistors M13 or M14 of the input differential pair of the latch circuit outside their saturation zone when the latch performs the evaluation.

Once evaluation is terminated, the switches M20 and M17 are closed (i.e. the transistors made conducting) in order to increase the speed during a recovery phase toward the respective equilibrium condition both of the amplifier and of the latch circuit.

The sequence of phases terminates with the cutting-off of the transistor M20 (switch open) thus resetting the comparator to begin a new phase of storage of the offset, followed by a new phase of subtraction of the offset and of comparison and so forth.

We claim:
1. A fully differential CMOS comparator utilizing a single, high-gain, fully differential, operational amplifier having a "folded cascode" configuration and having two input terminals IN+ and IN−, connected respectively to a switched capacitance input circuit for storage-subtraction of an offset voltage of the amplifier and of comparison, and two output terminals OUT+ and OUT− , functionally connected respectively to two input terminals of a latch circuit, said comparator producing on an output terminal of said latch circuit a logic signal indicative of the level of a signal fed to a first input terminal of said switched capacitance input circuit as compared to a constant reference voltage fed to a second input terminal of said switched capacitance input circuit and wherein said latch circuit is provided with a differential input stage formed by a differential pair of transistors having their respective sources connected in common and to the drain of a third transistor acting as a biasing current generator of the circuit;

said differential input stage transferring an output signal produced by said high-gain, fully differential, operational amplifier to two input nodes of a latch formed by at least a pair of cross-coupled transistors and by a reset switch connected between the gates of said cross-coupled pair of transistors;

a pair of output transistors of said fully differential, "folded cascode", operational amplifier having their respective gates connected in common and to the node of said sources connected in common of said differential pair of transistors of said differential input stage of the latch circuit, realizing a common mode feedback by means of said differential input stage of the latch circuit which controls the output common mode voltage of said high-gain operational amplifier.

2. A CMOS comparator according to claim 1, wherein each transistor of said pair of cross-coupled transistors of said latch has a respectively complementary transistor connected substantially in parallel thereto and having a gate connected to ground for limiting the negative potential excursion of the drains of said cross-coupled transistors of said latch.

* * * * *